United States Patent
Konno et al.

(10) Patent No.: US 7,608,859 B2
(45) Date of Patent: Oct. 27, 2009

(54) SEMICONDUCTOR LIGHT-EMITTING DEVICE WITH TRANSPARENT CONDUCTIVE FILM

(75) Inventors: Taichiroo Konno, Tsuchiura (JP); Kazuyuki Iizuka, Tsuchiura (JP); Masahiro Arai, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/485,316

(22) Filed: Jul. 13, 2006

(65) Prior Publication Data

US 2007/0075319 A1   Apr. 5, 2007

(30) Foreign Application Priority Data

Sep. 30, 2005   (JP)   ............... 2005-285822

(51) Int. Cl.
*H01L 27/15* (2006.01)

(52) U.S. Cl. .................. 257/79; 257/99; 257/103; 257/E33.001; 257/98; 257/102

(58) Field of Classification Search .................. 257/79, 257/99, 103, E33.001
See application file for complete search history.

(56) References Cited

U.S. PATENT DOCUMENTS

| | | | |
|---|---|---|---|
| 5,466,950 A * | 11/1995 | Sugawara et al. | 257/94 |
| RE35,665 E | 11/1997 | Lin et al. | |
| 5,856,682 A | 1/1999 | Sasaki | |
| 6,057,562 A * | 5/2000 | Lee et al. | 257/96 |
| 6,329,216 B1 * | 12/2001 | Matsumoto et al. | 438/47 |
| 7,034,328 B2 * | 4/2006 | Doverspike et al. | 257/14 |
| 2004/0021142 A1 * | 2/2004 | Kuo | 257/79 |
| 2004/0161006 A1 * | 8/2004 | Chang et al. | 372/45 |
| 2005/0050971 A1 * | 3/2005 | Horning | 74/5 R |
| 2005/0191179 A1 * | 9/2005 | Lai et al. | 415/220 |
| 2006/0001042 A1 * | 1/2006 | Suzuki et al. | 257/103 |
| 2006/0163603 A1 * | 7/2006 | Takeuchi et al. | 257/103 |

FOREIGN PATENT DOCUMENTS

| | | |
|---|---|---|
| JP | 8-83927 A | 3/1996 |
| JP | 08-293623 A | 11/1996 |
| JP | 08-321633 A | 12/1996 |
| JP | 2001-320083 A | 11/2001 |
| JP | 2002-100837 A | 4/2002 |
| JP | 2002-164569 A | 6/2002 |
| JP | 2004-241720 A | 8/2004 |
| JP | 2004-356600 A | 12/2004 |
| JP | 2005-209688 A | 8/2005 |
| JP | 2005-235797 A | 9/2005 |
| JP | 2005-235801 A | 9/2005 |
| JP | 2005-235802 | 9/2005 |
| JP | 2005-268601 A | 9/2005 |

* cited by examiner

*Primary Examiner*—Cuong Q Nguyen
*Assistant Examiner*—Trang Q Tran
(74) *Attorney, Agent, or Firm*—Foley & Lardner LLP

(57) ABSTRACT

A semiconductor light-emitting device with a transparent conductive film has: a light-emitting portion formed on a semiconductor substrate, the light-emitting portion having an n-type clad layer, an active layer and a p-type clad layer; an As-based contact layer formed on the light-emitting portion, the contact layer being doped with a p-type dopant of $1 \times 10^{19}/cm^3$ or more; a current spreading layer formed on the contact layer, the current spreading layer being formed of a transparent conductive film made of a metal oxide material; and a buffer layer formed between the contact layer and the p-type clad layer. The buffer layer has two or more buffer layer parts, and the adjacent buffer layer parts are different each other in material or composition.

2 Claims, 6 Drawing Sheets

SEMICONDUCTOR LIGHT-EMITTING DEVICE WITH TRANSPARENT CONDUCTIVE FILM

The present application is based on Japanese patent application No. 2005-285822 filed Sep. 30, 2005, the entire contents of which are incorporated herein by reference.

BACKGROUND OF THE INVENTION

1. Field of the Invention

The present invention relates to a semiconductor light-emitting device with a transparent conductive film and, more particularly, to a high-brightness semiconductor light-emitting device using the transparent conductive film as a current spreading layer.

2. Description of the Related Art

A light-emitting diode (herein referred to as LED) serving as a semiconductor light-emitting device, which is a high-brightness blue, green, orange, yellow or red LED, can be manufactured since a GaN-based or AlGaInP-based high-quality crystal can be grown by a MOVPE method in these years.

However, in order to achieve a high brightness, the current spreading layer must be increased in thickness such that an applied current is uniformly supplied into a chip plane of an LED. For example, in an AlGaInP-based LED device, the current spreading layer which is conventionally made of GaP or AlGaAs needs to have a large thickness of about 5 to 10 μm. Such a large amount of materials for the current spreading layer and a long processing (growth) time for the layer lead to a high manufacturing cost of the LED device.

In order to overcome the above problems, a method of using an ITO (Indium Tin Oxide) or ZnO (Zinc oxide) serving as a film having sufficient translucency and electric characteristics which can achieve preferable current spreading characteristics as a current spreading layer is proposed (see Japanese Patent Application Laid-open No. 8-83927). A method of directly forming an ITO film on a p-type clad layer is also proposed (see U.S. Reissue Pat. No. 35665 and U.S. Pat. No. 6,057,562).

As described above, an ITO film can be used as a current spreading layer, a conventional method of increasing a semiconductor layer serving as a current spreading layer to about 5 to 10 μm is not necessary, and, accordingly an epitaxial layer is not necessary. For this reason, a high-brightness LED device and an epitaxial wafer for an LED device can be manufactured at low cost.

However, when an ITO film is used as a window layer, a contact resistance is generated between a semiconductor layer and the ITO film comprising a metal oxide. And, there is a problem that a forward operation voltage disadvantageously increases. More specifically, the ITO film serving as a transparent conductive film (transparent electrode) comprises an n-type semiconductor. However, the upper clad layer being in contact with the ITO film comprises a p-type semiconductor. Therefore, when a forward operation voltage is applied to an LED, a reverse bias state is set between the transparent conductive film (transparent electrode) and the p-type clad layer. As a result, a current does not flow without applying a large voltage to the LED.

As a countermeasure against the problem, the following method is known. That is, a contact layer which is a thin layer with a high carrier density is formed between the ITO film and the p-type clad layer, and is in contact with the ITO film. Resultantly, an LED can be driven at a low voltage by a tunnel junction (for example, U.S. Reissue Pat. No. 35665). How- ever, since the p-type clad layer has a small thickness (i.e., when the p-type layer has only a thickness of 200 nm or more, it can function sufficiently as a clad layer), Zn serving as a dopant is likely to be diffused from the contact layer into an active layer.

The diffusion of the p-type dopant from the contact layer causes the following two problems. The first problem is a decrease in optical output of an LED device. When the dopant is diffused in a depth direction of the LED device and reached to an active layer of the LED device, the dopant becomes a defect in the active layer. The defect works as a nonradiative recombination component, and its optical output decreases with time. The second problem is an increase in drive voltage of the LED device. Since a substantial carrier density of the thin contact layer decreases due to the dopant diffusion, the tunnel junction cannot be easily achieved. For this reason, the drive voltage of the LED device disadvantageously increases.

As a method for solving the problems of the diffusion of a dopant, it is known to increase the distance between an active layer and a contact layer, i.e., to increase the thickness of a p-type clad layer, so as to suppress the diffusion of the dopant into the active layer. In this method, the same material as the p-type clad layer must be grown at a low growth rate, and the cost of the material must be increased.

On the other hand, U.S. Pat. No. 6,057,562 discloses a method that a buffer layer (to improve the current spreading) comprising, e.g., an AlGaAs layer, is formed between a p-type clad layer and a contact layer to enhance the current spreading to increase the optical output.

However, the inventors have found that, when conducting the method in U.S. Pat. No. 6,057,562 by using an AlGaAs layer etc. with a high Al ratio in mix crystal as a material comprising the buffer layer, dopant is easy to be diffused due to a heat during growth etc. and the degree of dopant diffusion becomes conspicuous. Therefore, in order to prevent the diffusion of the dopant from the contact layer into its active layer, the buffer layer must be increased in thickness.

SUMMARY OF THE INVENTION

It is an object of the invention to provide a semiconductor light-emitting device that can suppress the diffusion of dopant to secure a high brightness and a low drive voltage.

(1) According to the invention, a semiconductor light-emitting device with a transparent conductive film comprises:

a light-emitting portion formed on a semiconductor substrate, the light-emitting portion comprising an n-type clad layer, an active layer and a p-type clad layer;

an As-based contact layer formed on the light-emitting portion, the contact layer being doped with a p-type dopant of $1 \times 10^{19}/cm^3$ or more;

a current spreading layer formed on the contact layer, the current spreading layer comprising a transparent conductive film of a metal oxide material; and a buffer layer formed between the contact layer and the p-type clad layer, wherein the buffer layer comprises two or more buffer layer parts, and the adjacent buffer layer parts are different each other in material or composition.

In the invention (1) described above, the buffer layer is constructed such that a plurality of buffer layer parts to function as a diffusion suppressing layer are stacked in a multi-layer structure. Therefore, the total thickness of the buffer layer required to obtain the same dopant diffusion suppression function can be reduced, as compared to the case that the buffer layer is constructed by a single layer being uniform in material and composition. Further, even in the semiconductor light-emitting device that the contact layer comprising a p-type dopant at a high density is formed on the light-emitting portion and the current spreading layer comprising a metal oxide material is formed on the contact layer, the dopant diffusion from the contact layer can be effectively suppressed. Therefore, a high brightness and a low drive voltage are achieved, and a decrease in optical output and an increase in drive voltage with time can be suppressed even when operating the semiconductor light-emitting device.

In the above invention (1), the following modifications and changes (i) to (xxiii) can be made or combined each other.

(i) The buffer layer parts comprise a material transparent to an emission peak wavelength.

(ii) The buffer layer parts comprise $Al_xGa_{1-x}As$ ($0.4 \leq X \leq 1$) or $(Al_xGa_{1-x})_yIn_{1-y}P$ ($0.3 \leq X \leq 1$ and $0.4 \leq Y \leq 0.6$), and the buffer layer parts contain the Mg as a dopant.

The $Al_xGa_{1-x}As$ ($0.4 \leq X \leq 1$) is selected as a preferable material composing the buffer layer parts because it is transparent with respect to an emission wavelength, it is lattice-matched to a GaAs substrate, and it is inexpensive since it does not contain In with a high unit cost. However, the buffer layer parts may also comprise $(Al_xGa_{1-x})_yIn_{1-y}P$ ($0.3 \leq X \leq 1$ and $0.4 \leq Y \leq 0.6$) which is optically transparent with respect to the emission wavelength. The buffer layer parts are doped with Mg because the Mg is capable of being doped at a relatively high density and has smaller diffusion constant than the Zn. For this reason, the use of Mg is considered to be more appropriate to suppress Zn diffusion in the contact layer.

(iii) The buffer layer comprises a combination of a buffer layer part comprising $Al_xGa_{1-x}As$ ($0.4 \leq X \leq 1$) and a buffer layer part comprising $(Al_xGa_{1-x})_yIn_{1-y}P$ ($0.3 \leq X \leq 1$ and $0.4 \leq Y \leq 0.6$), and the buffer layer parts contain the Mg as a dopant.

(iv) The contact layer contains the Zn as a main dopant, the contact layer has a carrier density of $1 \times 10^{19}/cm^3$ or more, and the contact layer comprises $Al_xGa_{1-x}As$ ($0 \leq X \leq 0.4$).

The contact layer contains the Zn as a main dopant because the Zn is the best dopant for increasing its carrier density up to $1 \times 10^{19}/cm^3$ or more although the Zn disadvantageously has a relatively large diffusion constant. A semiconductor material which can stably realize a contact layer with a high carrier density of $1.0 \times 10^{19}/cm^3$ or more is limited. According to studies of the inventors, as a semiconductor to realize a high carrier density of $1.0 \times 10^{19}/cm^3$ or more, the Zn-doped $Al_xGa_{1-x}As$ ($0 \leq X \leq 0.4$) is optimum. However, since AlGaAs is not transparent with respect to the emission wavelength, the AlGaAs layer needs to be formed to have a thickness of about 30 nm or less.

(v) The p-type clad layer contains the Mg as a dopant, and the p-type clad layer, the n-type clad layer and the active layer comprise $(Al_xGa_{1-x})_yIn_{1-y}P$ ($0 \leq X \leq 1$ and $0.4 \leq Y \leq 0.6$).

The reason why the above-mentioned material is selected as the preferred material composing the active layer, then-type clad layer and the p-type clad layer is that the above-mentioned material which is a kind of nearly lattice-matched materials to the GaAs substrate is optically transparent with respect to a wavelength of light emitted from the LED device. The p-type clad layer contains the Mg as a dopant because the Mg is capable of being doped at a relatively high density and the Zn diffusion from the contact layer can be suppressed since the diffusion constant of the Mg is smaller than that of the Zn.

(vi) At least one of the two or more buffer layer parts alternately formed comprises an undoped layer.

(vii) The undoped layer has a carbon density of $5 \times 10^{17}$ atoms/$cm^3$ or less.

The Zn Diffusion from the contact layer is also changed by the density of C (carbon) in the undoped layer composing the buffer layer part. Since the diffusion of Zn increases as the density of C increases, the optical output decreases. From this point of view, a concrete value of the density of C (carbon) is preferably set at $5 \times 10^{17}$ atoms/$cm^3$ or less.

(viii) The semiconductor light-emitting device further comprises: an undoped layer formed between the active layer and the p-type clad layer.

(ix) The semiconductor light-emitting device further comprises: a p-type low-density layer formed between the active layer and the p-type clad layer, wherein a carrier density of the p-type low-density layer is lower than that of the p-type clad layer.

(x) The semiconductor light-emitting device further comprises: an undoped layer formed between the n-type clad layer and the active layer.

(xi) The semiconductor light-emitting device further comprises: an n-type low-density layer formed between the n-type clad layer and the active layer, wherein a carrier density of the n-type low-density layer is lower than that of the n-type clad layer.

(xii) The current spreading layer comprises any one of ITO (Indium Tin Oxide), ZnO (Zinc Oxide), CTO (Cadmium Tin Oxide), and AZO (Aluminum Zinc Oxide).

(xiii) The current spreading layer has a thickness in a range of $\pm 30\%$ of d determined by a relational expression: $d = A \times \lambda_P/(4 \times n)$, where A is a constant (A=1 or 3), $\lambda_P$ is an emission wavelength (nm), and n is a refractive index.

(xiv) The semiconductor light-emitting device further comprises: a light-reflecting layer formed between the semiconductor substrate and the n-type clad layer, wherein the light-reflecting layer comprises a semiconductor multilayered film comprising at least 15 pairs of two semiconductor layers which are different each other in the refractive index.

(xv) The current spreading layer has a carrier density of $8 \times 10^{20}/cm^3$ or more in a state just after it is formed.

In order to reduce the tunnel voltage, the current spreading layer (ITO film) has preferably a higher carrier density in conjunction with making the carrier density of the contact layer high. More specifically, the current spreading layer has preferably a carrier density of $8 \times 10^{20}/cm^3$ or more.

(xvi) The active layer has a multiquantum well structure or a strained-multiquantum well structure.

(xvii) The active layer has a multihetero structure without a quantum effect.

(xviii) The p-type clad layer and the buffer layer have, in total, a thickness of 1000 nm or more and 3000 nm or less, and the p-type clad layer has a thickness of 200 nm or more and 600 nm or less.

The lower limit of the film thickness from the active layer to the contact layer is to be set at 1000 nm or more because the LED device may be broken by ultrasonic vibration or the like at a wire bonding step in manufacturing an LED device when the distance between the active layer and a surface electrode is too short. In contrast to this, the upper limit is to be set at 3000 nm or less for the following reason. That is, since the sufficient characteristics of the current spreading of the LED device can be expected by the ITO film formed on the contact layer, the buffer layer need not be formed to have a large thickness, and the thickness of the buffer layer can be rather reduced to save the manufacturing cost of the LED device. Since the film thickness of the p-type clad layer ranges from 200 to 600 nm, the thickness of the buffer layer preferably falls within a range of about 400 to 2800 nm.

(xix) The contact layer has a thickness of 1 nm or more and 30 nm or less.

(xx) The light-reflecting layer comprises a combination of $(Al_xGa_{1-x})_yIn_{1-y}P$ ($0 \leq X \leq 1$ and $0.4 \leq Y \leq 0.6$) and $Al_xGa_{1-x}As$ ($0 \leq X \leq 1$).

The reason why these materials which are kinds of nearly lattice-matched materials to the GaAs substrate is optically transparent with respect to a wavelength of light emitted from the LED device. As well known, when the difference between the refractive indexes of two types of materials composing a DBR (Distributed Bragg Reflector) to serve as a light-reflecting layer is increased, the reflection wavelength band can be widened and the reflectivity can be enhanced. Therefore, the above-mentioned materials can be preferably selected.

(xxi) The undoped layer, the n-type low-density layer or the p-type low-density layer has a thickness of 100 nm or less.

If the film thickness of the undoped layer or the low-density layer being in contact with the active layer is excessively increased, carriers supplied to the active layer are reduced to decrease the optical output, and the fabricating cost increases. For this reason, it is desirable that the film thickness is 100 nm or less.

(xxii) The buffer layer parts of the buffer layer each have a thickness of 10 nm or more.

In order to cause each of buffer layer parts to function as a diffusion suppressing layer, the film thickness of one layer of the buffer layer part needs to be 10 nm or more.

(xxiii) The semiconductor light-emitting device further comprises: a buffer layer formed on the semiconductor substrate, wherein the buffer layer has an n-type conductivity and comprises a same material as the semiconductor substrate.

The invention assumes the semiconductor light-emitting device that: at least the n-type clad layer, the active layer, and the p-type clad layer are formed on the semiconductor substrate; the thin As-based contact layer doped with a p-type dopant at a high density of $1 \times 10^{19}/cm^3$ or more is formed on the upper side of these layers; and the current spreading layer comprising a transparent conductive film made of a metal oxide material is formed on the As-based contact layer. The dopant of the p-type clad layer is, for example, Mg, and the dopant of the thin contact layer with a high carrier density is, for example, Zn.

In the above semiconductor light-emitting device according to the invention, the buffer layer comprising at least two buffer layer parts, the adjacent buffer layer parts of which comprises different materials or compositions, is formed between the contact layer and the p-type clad layer. More specifically, the buffer layer parts each comprise a material selected from $Al_xGa_{1-x}As$ ($0.4 \leq X \leq 1$) or $(Al_xGa_{1-x})_yIn_{1-y}P$ ($0.3 \leq X \leq 1$ and $0.4 \leq Y \leq 0.6$) which is transparent with respect to an emission wavelength, or the buffer layer parts comprise a combination of $Al_xGa_{1-x}As$ ($0.4 \leq X \leq 1$) and $(Al_xGa_{1-x})_yIn_{1-y}P$ ($0.3 \leq x1$ and $0.4 \leq Y \leq 0.6$) which are transparent with respect to the emission wavelength. That is, the buffer layer is composed of a hetero-junction between the two or more buffer layer parts.

In order to cause each of the buffer layer parts to function as a diffusion suppressing layer, at least two buffer layer parts are stacked in a multilayer structure to compose the buffer layer. Therefore, the dopant diffusion from the contact layer can be suppressed more effectively than the case that the buffer layer is composed of a single layer comprising a conventional material or a uniform composition. Therefore, while keeping the same function of the dopant diffusion suppressing as the conventional, the total thickness of the buffer layer can be smaller than that of the conventional one.

<Advantages of the Invention>

According to the invention, since the plurality of buffer layer parts to function as a diffusion suppressing layer are stacked in a multilayer structure to compose the buffer layer, suppressing the dopant diffusion from the contact layer can be effectively achieved as well as having a high brightness and a low drive voltage of the semiconductor light-emitting device. And they can suppress a decrease in optical output and an increase in drive voltage with time. Further, according to the invention, the total thickness of the buffer layer can be smaller than the conventional one, and the LED device can be fabricated with excellent device characteristics at a low cost.

DESCRIPTION OF THE PREFERRED EMBODIMENTS

Figure 1:
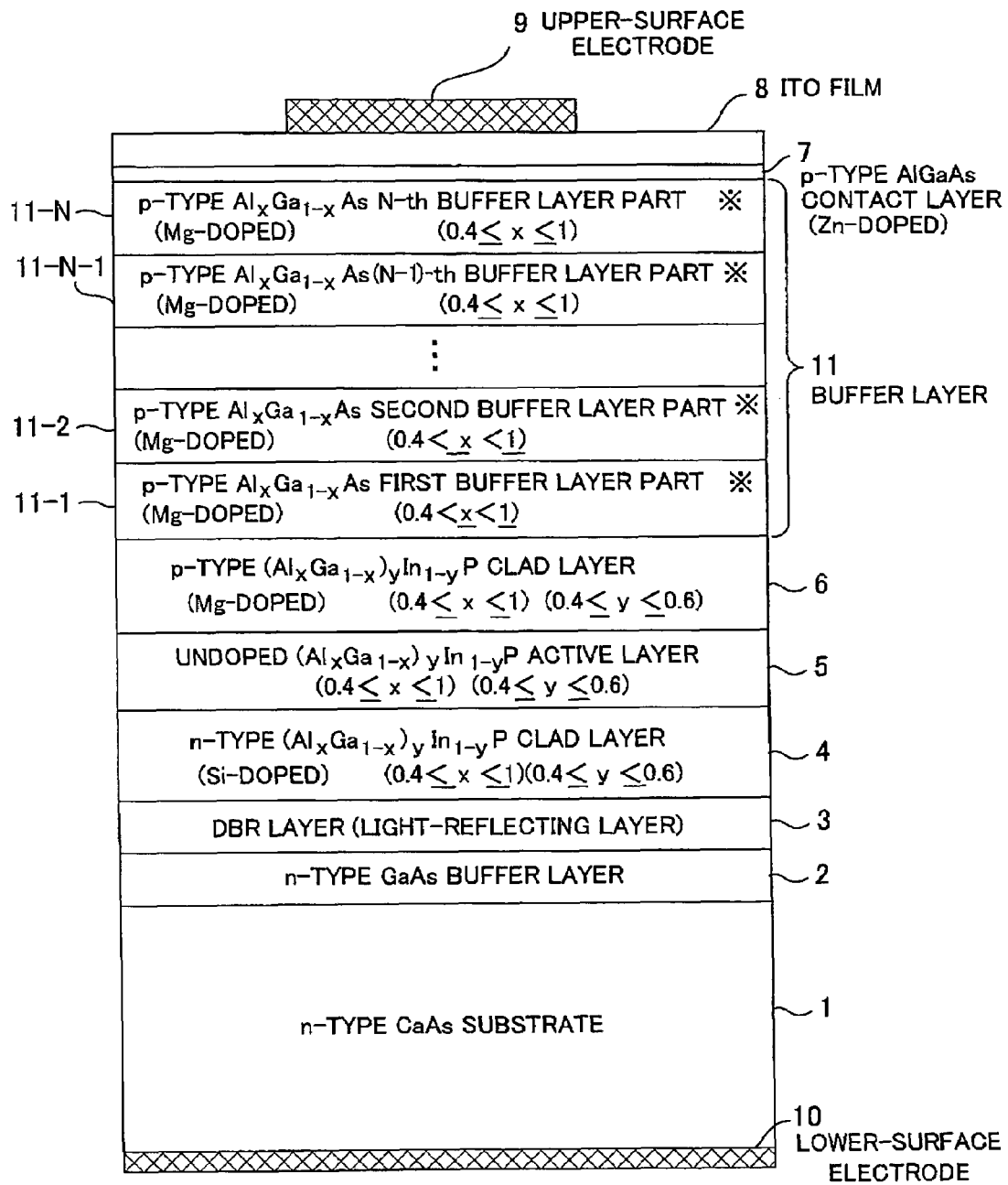
FIG. 1 is a schematic cross sectional view showing an AlGaInP-based red LED in a preferred embodiment of the invention.

The present invention will be described below with reference to embodiments shown in the drawings.

FIG. 1 shows the structure of a light-emitting diode according to the preferred embodiment. In the light-emitting diode, on an n-type GaAs substrate 1 serving as a semiconductor substrate, an n-type GaAs buffer layer 2, an n-type light-reflecting layer 3 composed of a DBR (Distributed Bragg Reflector), an n-type AlGaInP clad layer (to also be simply referred to as an n-type clad layer) 4, an undoped AlGaInP active layer 5, and a p-type AlGaInP clad layer (to also be simply referred to as a p-type clad layer) 6 are sequentially grown to compose a light-emitting portion. On the uppermost layer of the resultant structure, i.e., the p-type clad layer 6, a p-type AlGaAs contact layer (to also be simply referred to as a p-type contact layer) 7 added with a p-type dopant at a high density is stacked. Furthermore, on the p-type contact layer 7, an ITO film 8 serving as a transparent conductive film is stacked as a current spreading layer comprised of a metal oxide material. An upper-surface electrode 9 is formed on the upper-surface side of the resultant structure, and a lower-surface electrode 10 is formed on the lower-surface side of the resultant structure.

The active layer 5 has a composition of $(Al_xGa_{1-x})_yIn_{1-y}P$ ($0 \leq X \leq 1$ and $0.4 \leq Y \leq 0.6$), and the p-type clad layer 6 has a composition of $(Al_xGa_{1-x})_yIn_{1-y}P$ ($0.6 \leq X \leq 1$ and $0.4 \leq Y \leq 0.6$). A dopant of the n-type clad layer 4 is Si, and a dopant of the p-type clad layer is Mg.

The p-type contact layer 7 is comprised of $Al_xGa_{1-x}As$ ($0 \leq X \leq 0.4$), has a film thickness of 1 nm or more and 30 nm or less, and doped with Zn at a high density of $1 \times 10^{19}/cm^3$ or more.

The film thickness of the ITO film 8 serving as the current spreading layer falls within a range of ±30% of d calculated by a relational expression of d=A×$\lambda_P$/(4×n), where A is a constant (A=1 or 3), $\lambda_P$ is an emission wavelength (nm), and n is a refractive index. The ITO film 8 serving as the current spreading layer is formed by a vacuum deposition method or a sputtering method. Immediately after the film formation, the ITO film 8 has a carrier density of $8\times10^{20}$/cm$^3$ or more.

As a characteristic feature of the light-emitting diode, a p-type buffer layer 11 added as Mg as a main p-type dopant and comprised of Al$_x$Ga$_{1-x}$As (0.4≦X≦1) is formed between the p-type contact layer 7 and the p-type clad layer 6.

The p-type buffer layer 11 has a structure obtained by stacking at least two layers comprising different materials or different compositions, in this embodiment, N buffer layer parts 11-1, ..., 11-N (N is a natural number of 2 or more). In FIG. 1, the N-th buffer layer part 11 is composed of a first buffer layer part 11-1, a second buffer layer part 11-2, ..., N-th buffer layer part 11-N. Each of the N-th buffer layer parts 11-1, ..., 11-N has a film thickness of 10 nm or more and comprising Al$_x$Ga$_{1-x}$As (0.4≦X≦1). However, the values x in the Al compositions of the layer parts are different from each other. Magnesium is added a sap-type dopant to the N-th buffer layer parts 11-1, ..., 11-N.

The film thickness of the p-type buffer layer 11 is set such that a sum of the thicknesses (in general, 200 to 600 nm) of the p-type clad layers falls within a range of 1000 to 3000 nm. The film thickness is set to obtain a structure which can prevent a device from being broken in a wire bonding step. As a concrete thickness, the film thickness of the p-type clad layer is 200 nm or more and 600 nm or less in general. For this reason, the film thickness of the buffer layer 11 is set within a range of about 400 to 2800 nm. Since a buffer layer 11 in a conventional art requires a film thickness of 3000 nm or more, it is understood that the buffer layer 11 of the embodiment is formed as a further thin layer.

According to the structure, since the N-th buffer layer parts 11-1, ..., 11-N function as diffusion suppressing layers, the film thickness of the p-type buffer layer 11 is thin, i.e., about 400 to 2800 nm. Even though the layer 11 is thin, with respect to diffusion of a p-type dopant Zn from the p-type contact layer 7 into the light-emitting portion, the same function of the dopant diffusion suppressing as that obtained when the buffer layer comprises the same material or the same composition can be achieved.

In the embodiment described above, although AlxGa$_{1-x}$As (0.4≦X≦1) is used as the materials of the N-th buffer layer parts 11-1, ..., 11-N, in place of the material, (Al$_x$Ga$_{1-x}$)$_y$In$_{1-y}$P (0.3≦X≦1 and 0.4≦Y≦0.6) can also be used. However, the values in the Al compositions of the buffer layer parts are made different from each other.

The p-type buffer layer 11 in which at least two buffer layer parts comprising different materials alternately formed can also comprise a combination of a buffer layer part comprising Al$_x$Ga$_{1-x}$As (0.4≦X≦1) and a buffer layer part comprising (Al$_x$Ga$_{1-x}$)$_y$In$_{1-y}$P (0.3≦X≦1 and 0.4≦Y≦0.6).

Furthermore, in the p-type buffer layer 11, at least one layer of the buffer layer parts comprising AlxGa$_{1-x}$As (0.4≦X≦1) and (Al$_x$Ga$_{1-x}$)$_y$In$_{1-y}$P (0.3≦X≦1 and 0.4≦Y≦0.6) can be an undoped layer. Carbon (C) is purposely or unavoidably added to the undoped layer, and a carbon density is suppressed to $5\times10^{16}$ atoms/cm$^3$ or less by setting a V/III ratio. In this case, "purposely" means that doping is aggressively or intentionally performed, and "unavoidably" means an inevitable phenomenon in which C (carbon) is naturally mixed in crystal although doping is not aggressively, intentionally, or purposely performed. The expression "undoped" used in the specification means that doping is not aggressively, intentionally, or purposely performed. The specification does not denote a phenomenon in which an impurity such as C (carbon) is naturally, inevitably mixed in the crystal.

Optimum conditions to obtain a semiconductor light-emitting device with a transparent conductive film according to the present invention will be described below.

Firstly, the contact layer 7 being in contact with the ITO film 8 must be added with a conductivity determining impurity at a very high density. More specifically, in the contact layer 7 added with Zn (zinc), as the crystal material, GaAs or AlGaAs having an Al mixed-crystal ratio of 0 to 0.4 is preferably used. The carrier density of the contact layer 7 is preferably $1\times10^{19}$/cm$^3$ or more. The carrier density is preferably set to be high. The ITO film 8 basically belongs to n-type semiconductor materials. However, an LED is generally manufactured such that the p-type side is up. For this reason, in an LED in which the ITO film 8 is applied as a current spreading layer, conductivity types are arranged from the substrate side to obtain an n/p/n junction, and a potential barrier is generated on an interface between the ITO film 8 and the p-type semiconductor layer. As a result in this case, an LED having a very high operation voltage is obtained. In order to solve the problem, a contact layer 7 having a very high carrier density is required as a p-type semiconductor layer. The reason why a band gap of the contact layer 7 is narrow strongly depends on that a high carrier density can be easily achieved in the case of the narrow band gap.

Furthermore, in conjunction with making the carrier density of the contact layer 7 high, the carrier density of the ITO film 8 being in contact with the contact layer 7 is important to reduce a tunnel voltage. For the same reason as that of the contact layer 7, the carrier density is preferably set to be high. More specifically, the carrier density of the ITO film 8 is preferably $8\times10^{20}$/cm$^3$ or more.

Secondly, the film thickness of the contact layer 7 preferably falls within a range of 1 to 30 nm. Since the contact layer 7 has a band gap serving as an absorbing layer with respect to light emitted from the active layer 5, an optical output decreases as the film thickness increases. Therefore, the upper limit of the film thickness of the contact layer 7 is preferably set at 30 nm. More preferably, the upper limit is set at 25 nm. When the film thickness of the contact layer 7 is less than 1 nm, a tunnel junction between the ITO film 8 and the contact layer 7 becomes difficult. For this reason, a low operation voltage and stability of the operation voltage are difficult. Therefore, the film thickness of the contact layer 7 preferably falls within a range of 1 to 30 nm.

Thirdly, the film thickness of the ITO film 8 is preferably given by a relational expression of d=A×$\lambda_P$/(4×n), where A is a constant (A=1 or 3), $\lambda_P$ is an emission wavelength. (nm), and n is a refractive index. The ITO film 8 formed on an epitaxial wafer for LED has a refractive index, which is an intermediate value between the refractive indexes of the semiconductor layer and an air layer and has optically functions as a reflection preventing film. For this reason, in order to improve light extracting efficiency of an LED and to obtain an LED device having a higher output, the film thickness given by the above expression is preferable. Furthermore, depending on a forming method or film quality of the ITO film, both the transmittance of the ITO film 8 and an optical output decreases as the thickness of the ITO film 8 increases. For this reason, $\lambda_P$/(4×n) is more preferable. This is because the wavelength band of the reflection preventing film with a low optical reflectivity has a certain range. For example, a tolerance of the film thickness of the reflection preventing film with a reflectivity of 15% or less falls within a range of ±30% of the film thickness d calculated by the above expression. If the film thickness d exceeds the range of ±30%, the effect of the reflection preventing film decreases. As a result, the optical output of the LED decreases.

Fourthly, the number of pairs of the light-reflecting layers 3 is preferably 10 to 30 for the following reason. That is, 10 or more pairs are required to achieve a sufficient reflectance, and an optical output tends to be saturated when the number of pairs is over 30. More preferably, the number of pairs is 15 or more and 25 or less.

In the contents described in the present invention, depending on circumstances, the compositions of the p-type buffer layer 11 and the p-type clad layer 6 may be equal to each other. In this case, the distance from the upper end of the active layer 5 to the lower end of the contact layer 7 is preferably 1000 nm or more and 3000 nm or less.

Fifthly, as a material added to the p-type buffer layer 11, GaP is not desired to be used. If GaP is used, forward voltage in the LED characteristic increases due to discontinuity of the bands between the GaP and AlGaInP (including the AlInP and the GaInP) and between the GaP and the AlGaAs.

The present invention will be described in detail with reference to examples and comparative examples.

EXAMPLE 1

Figure 2:
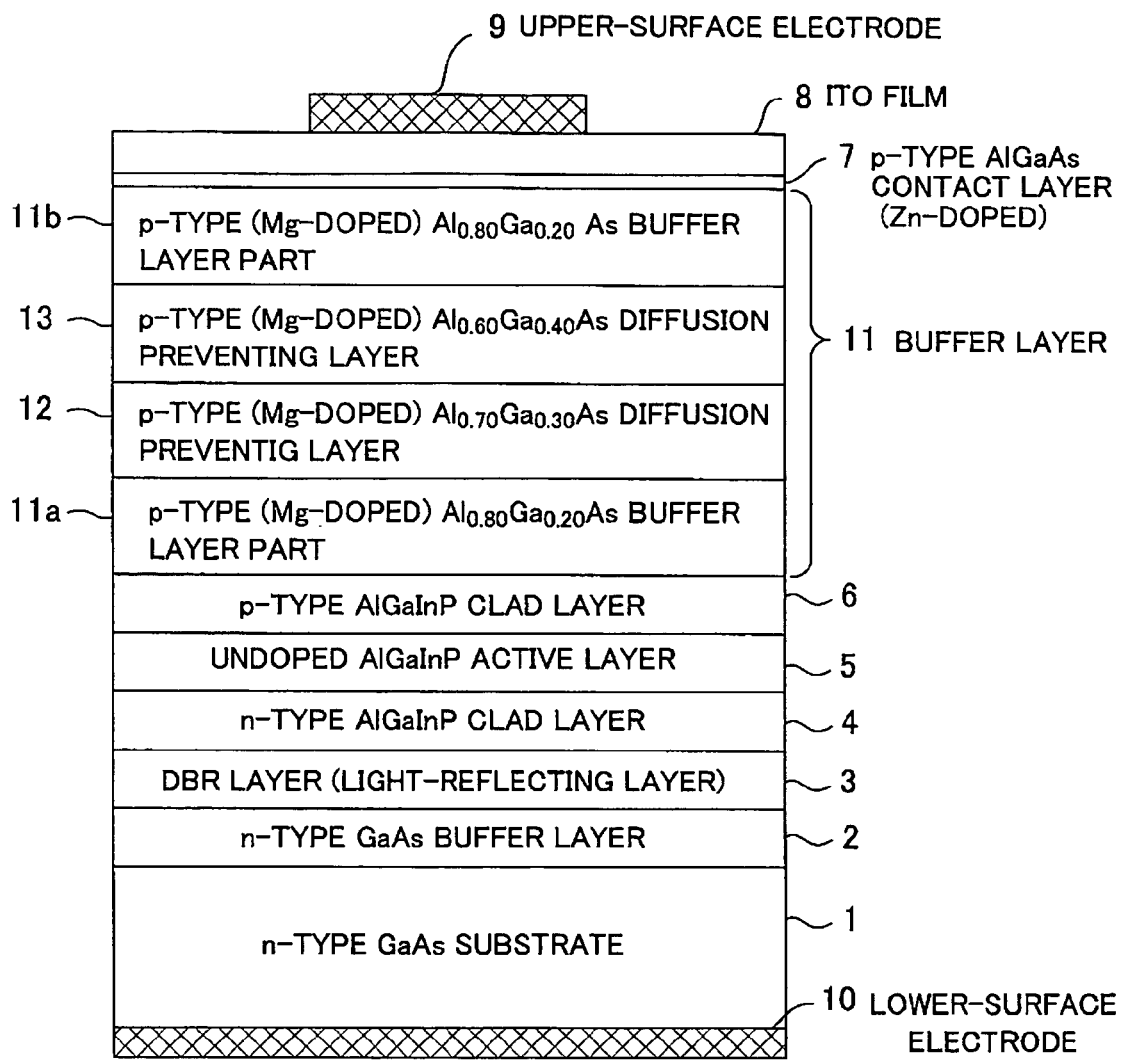
FIG. 2 is a schematic cross sectional view showing an AlGaInP-based red LED in Example 1 of the invention.

As Example 1, an epitaxial wafer for red LED having the structure as shown in FIG. 2 and an emission wavelength of about 630 nm is manufactured. An epitaxial growth method, an epitaxial layer thickness, an epitaxial layer structure, an electrode forming method, and an LED device manufacturing method will be described below.

On the n-type GaAs substrate 1, by using an MOVPE method, the n-type GaAs (Si-doped) buffer layer 2 (film thickness of 200 nm and a carrier density of $1 \times 10^{18}/cm^3$), the n-type light-reflecting layer (so-called DBR layer) 3 (carrier density of $1 \times 10^{18}/cm^3$), the n-type (Si-doped) $(Al_{0.7}Ga_{0.3})_{0.5}In_{0.5}P$ clad layer 4 (film thickness of 400 nm and carrier density of $7 \times 10^{17}/cm^3$), the undoped $(Al_{0.1}Ga_{0.9})_{0.5}In_{0.5}P$ active layer 5 (film thickness of 600 nm), the p-type (Mg-doped) $(Al_{0.7}Ga_{0.3})_{0.5}In_{0.5}P$ clad layer 6 (film thickness of 300 nm and carrier density of $4 \times 10^{17}/cm^3$), the buffer layer 11 (film thickness of 960 nm), and the p-type (Zn-doped) $Al_{0.1}Ga_{0.9}As$ contact layer 7 (film thickness of 3 nm and carrier density of $7 \times 10^{19}/cm^3$ are sequentially grown as a laminated structure.

The light-reflecting layer 3 is composed of a DBR (Distributed Bragg Reflector) obtained by alternately stacking 20 AlInP layers and 20 $Al_{0.4}Ga_{0.6}As$ layers, i.e., 20 pairs of the layers. The film thickness of the p-type clad layer 6 is 300 nm because the thickness of about 300 nm is a sufficient film thickness for a carrier confining effect and a carrier supplying layer. More specifically, the p-type clad layer 6 having a film thickness of about 300 nm sufficiently functions as a clad layer.

The buffer layer 11 is composed of at least two or more buffer layer parts, the adjacent buffer layer parts comprising different materials or different compositions. In Example 1, p-type (Mg-doped) $Al_{0.80}Ga_{0.20}As$ buffer layer part 11a (carrier density of $1 \times 10^{18}/cm^3$) is formed as a first buffer layer part on the p-type clad layer 6 to have a thickness of 460 nm, a p-type (Mg-doped) $Al_{0.70}Ga_{0.30}As$ diffusion preventing layer 12 is formed as a second buffer layer part to have a thickness of 20 nm, a p-type (Mg-doped) $Al_{0.60}Ga_{0.40}As$ diffusion preventing layer 13 is formed as a third buffer layer part on the p-type (Mg-doped) $Al_{0.70}Ga_{0.30}As$ diffusion preventing layer 12 to have a thickness of 20 nm, and a p-type (Mg-doped) $Al_{0.80}Ga_{0.20}As$ diffusion preventing layer 11b (carrier density of $1 \times 10^{18}/cm^3$) is formed as a fourth buffer layer part to have a thickness of 460 nm. More specifically, the buffer layer 11 composed of the p-type (Mg-doped) $Al_{0.80}Ga_{0.20}As$ diffusion preventing layer 11b (460 nm)/ $Al_{0.60}Ga_{0.40}As$ diffusion preventing layer 13 (20 nm)/ $Al_{0.70}Ga_{0.30}As$ diffusion preventing layer 12 (20 nm) / $Al_{0.80}Ga_{0.20}As$ buffer layer part 11a (460 nm) is formed between the contact layer 7 and the p-type clad layer 6.

A growth temperature in the MOVPE growth is set at 650° C. from the n-type GaAs buffer layer 2 to the p-type clad layer 6 and the buffer layer 11, and a growth temperature of the p-type contact layer 7 is set at 550° C. As the other growth conditions, a growth pressure is about 6666 Pa (50 Torr), growth rates of the respective layers are ranged from 0.3 to 1.0 nm/sec, and a V/III ratio is about 150. Note that a V/III ratio of the p-type contact layer 7 is set at 10. The V/III ratio mentioned here is a ratio (quotient) obtained when a denominator is the number of moles of a III group material such as TMGa or TMAl and a numerator is the number of moles of a V-group material such as $AsH_3$ or $PH_3$.

As a material used in the MOVPE growth, for example, an organic metal such as trimethyl gallium (TMGa) or triethyl gallium (TEGa), trimethyl aluminum (TMAl), trimethyl indium (TMIn) or a hydride gas such as arsine ($AsH_3$) or phosphine ($PH_3$) is used. For example, as an additive material of an n-type layer such as the n-type buffer layer 2, disilane is used. As an additive material of a conductivity determining impurity of a p-type layer such as the p-type clad layer 6, biscyclopentadienyl magnesium ($Cp_2Mg$) is used. However, diethyl zinc (DEZn) is used in only the p-type contact layer 7.

Furthermore, as an additive material of a conductivity determining impurity of the n-type layer, hydrogen selenide ($H_2Se$), monosilane ($SiH_4$), and diethyl tellurium (DETe) can also be used. As p-type additive materials of the p-type clad layer 6 and the p-type contact layer 7, dimethyl zinc (DMZn) and diethyl zinc (DEZn) can be used.

In addition, after the epitaxial wafer grown for LED is conveyed from the MOVPE apparatus, the ITO film 8 with a film thickness of 270 nm is formed by a vacuum deposition method on the upper surface of the wafer, i.e., the upper surface side of the p-type contact layer 7.

At this time, an evaluating glass substrate set in the same batch of deposition of the ITO film 8 is picked out and cut in a size adequate to perform the Hall measurement, and the electric characteristics of the ITO film 8 itself is evaluated. As a result, a carrier concentration of $1.1 \times 10^{21}/cm^3$, a mobility of 18 $cm^2/Vs$, and a resistivity of $2.9 \times 10^{-4}$ Ω·cm are evaluated.

On the upper surface of the epitaxial wafer, by using a well-known apparatus used in a general photolithography process for a resist or a mask aligner, the upper-surface electrode 9 as a circular electrode and with a diameter of 110 μm is formed in the shape of a matrix by a vacuum deposition method. A liftoff method is used in electrode formation after the deposition. As the upper-surface electrode 9, Ni (nickel) and Au (gold) are sequentially deposited to have thicknesses of 20 and 500 nm, respectively. Furthermore, on the entire bottom surface of the epitaxial wafer, the lower-surface electrode 10 is formed by the same vacuum deposition method. As the lower-surface electrode 10, AuGe (gold-germanium alloy), Ni (nickel), and Au (gold) are sequentially deposited to have thicknesses of 60, 10, and 500 nm, respectively. Thereafter, an alloy process which is alloying of an electrode is performed such that the electrode is heated to 400° C. in a nitrogen gas atmosphere and is held for 5 minutes.

Thereafter, an epitaxial wafer for LED having an electrode composed as described above is cut by a dicing machine such that the circular upper-surface electrode 9 is located at the center, thereby manufacturing an LED bear chip with a chip size of 300 μm square. Furthermore, the LED bear chip is mounted (die-bonding) on a TO-18 stem. Thereafter, wire bonding is performed to the LED bear chip to manufacture an LED device.

As a first modification of Example 1, an epitaxial wafer for LED in which the diffusion suppressing layers 12 and 13 are composed of undoped layers is also manufactured to make the epitaxial wafer for LED into a device.

Initial characteristics of the LED device manufactured as described above are evaluated. As a result, the LED device having excellent initial characteristics, e.g., an optical output of 1.85 mW and an operation voltage of 1.84 V during the power feeding at 20 mA (in evaluation) could be obtained. As an LED device including an undoped layer, an LED device having excellent initial characteristics, i.e., an optical output of 1.87 mW and an operation voltage of 1.86 V could be obtained.

With respect to Example 1 and the first modification, the LED devices are driven at 50 mA in an environment of an atmospheric humidity and are subjected to a continuous burn-in test for 168 hours (1 week) without changing the conditions. As relative comparative values to the state before the test, in the case of Example 1, an output is 90% (provided that optical output before the power feeding is 100%; hereinafter referred to as a relative output) and an operation voltage is +0.004 V (increase by about 0.2%), and in the case of the first modification, a relative output is 93% and an operation voltage is +0.004 V (increase by 0.2%).

The LED devices of Example 1 in both a state obtained immediately after the LED device is manufactured and a state obtained after the burn-in test under the aforementioned conditions are subjected to an SIMS analysis. As a result, it is confirmed that the Zn serving as a dopant of the p-type contact layer is not substantively detected in the active layer in the LED devices of Example 1 both before and after the burn-in test, which means that the Zn is rarely diffused in the active layer. More specifically, the dopant diffusion in the LED device could be suppressed.

Furthermore, as a second modification of Example 1, an LED having a structure in which a $(Al_{0.6}Ga_{0.4})_{0.5}In_{0.5}P$ diffusion preventing layer and a $(Al_{0.5}Ga_{0.5})_{0.5}In_{0.5}P$ diffusion preventing layer are inserted into the buffer layer 11 in place of insertion of the $Al_{0.70}Ga_{0.30}As$ diffusion preventing layer 12 and the $Al_{0.60}Ga_{0.40}As$ diffusion preventing layer 13 is manufactured. In this structure, an LED with excellent initial characteristics could be manufactured. The reliability of the LED is further better than that of an LED composed of the materials which are not replaced. Here, the reliability means the relative output.

EXAMPLE 2

Figure 3:
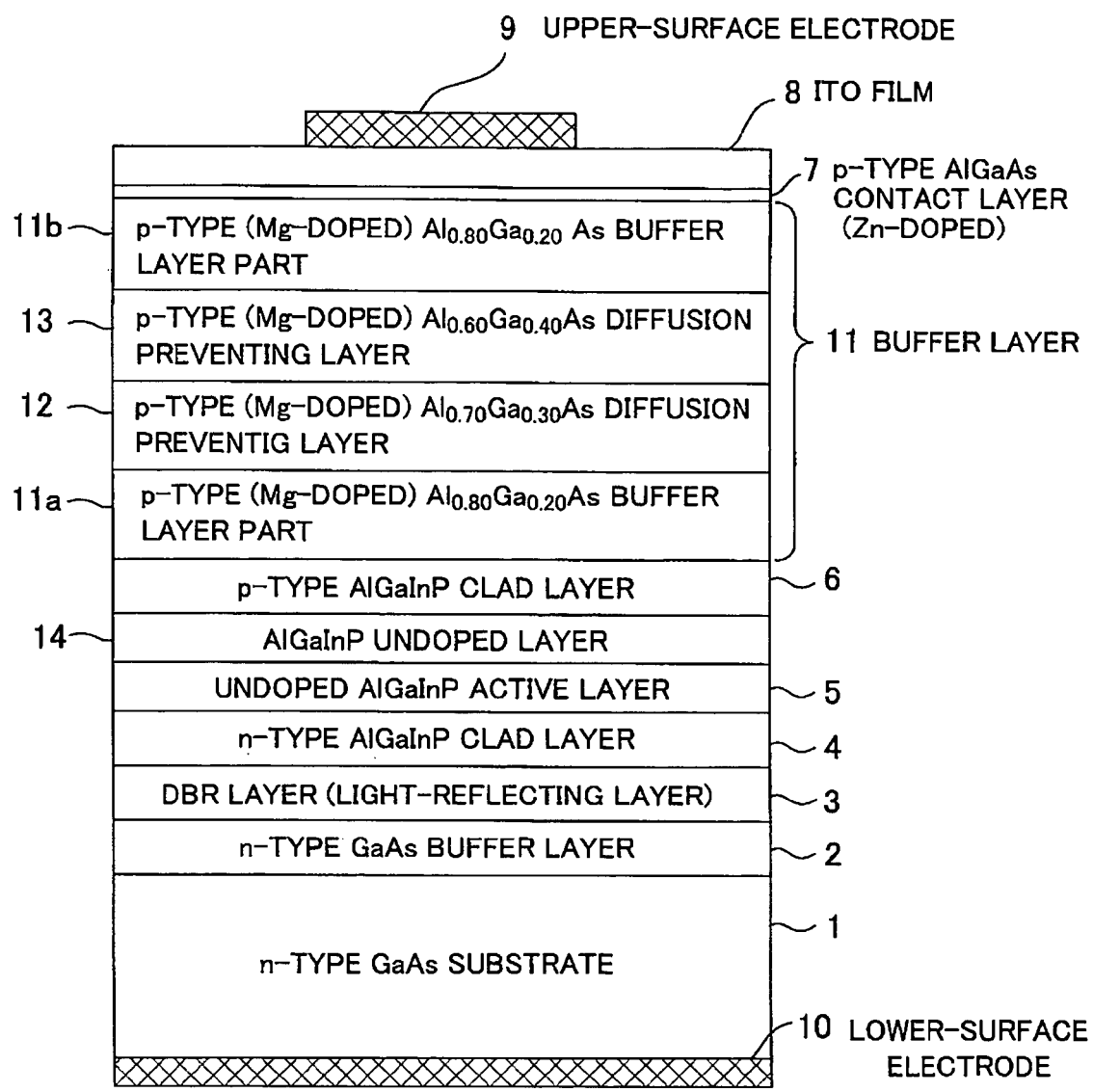
FIG. 3 is a schematic cross sectional view showing an AlGaInP-based red LED in Example 2 of the invention.

As Example 2, an epitaxial wafer for red LED having the structure as shown in FIG. 3 and an emission wavelength of about 630 nm is manufactured. An epitaxial growth method, an epitaxial layer thickness, an epitaxial layer structure, and an LED device manufacturing method are basically the same as those in Example 1 (FIG. 2). The different points between Example 1 and Example 2 are the following points.

In Example 2, it employed a structure in which an undoped layer is formed as a diffusion preventing layer 14 between the active layer 5 and the p-type clad layer 6. The diffusion preventing layer 14 is a layer which suppresses a p-type dopant diffused from the upper p-type semiconductor layer including the p-type clad layer from being mixed in the active layer 5. The composition of the diffusion preventing layer 14 is made equal to that of the p-type clad layer 6, and the film thickness of the diffusion preventing layer 14 is set at 100 nm. When the diffusion preventing layer 14 is excessively thick, supply of carriers to the active layer 5 becomes poor, then the optical output decreases, and the cost increases.

An epitaxial wafer for LED manufactured as described above is made into a device. The process of making the epitaxial wafer into a device is the same as that in Example 1.

The initial characteristics of the LED device according to Example 2 manufactured as described above are evaluated. As a result, as the initial characteristics, an optical output is 1.97 mW, and an operation voltage is 1.843 V.

With respect to the LED device according to Example 2, a reliability test is executed under the same conditions as those in the burn-in test in Example 1. As a result, a relative output of the LED device is 101.3%, and an operation voltage did not change at all.

The hetero-layer formed in the buffer layer 11 is composed of the layers of AlGaInP with different mixed crystal ratio or the layers of AlGaAs with different mixed crystal ratio. However, when a material which is transparent with respect to the light emitted from the active layer 5 is used, the hetero-layer may be composed of a combination of the compositions. For example, when a combination of AlGaInP and AlGaAs is used, the same effect as described above can be obtained as a matter of course.

Example 2 in the invention employs the intrinsic undoped layer that is formed between the active layer and the p-type clad layer. Alternatively, a pseudo-undoped layer to pseudo-serve as an undoped layer even when containing some conductive impurity or a low-carrier density clad layer (p-type low-density layer) may be formed.

Figure 4:
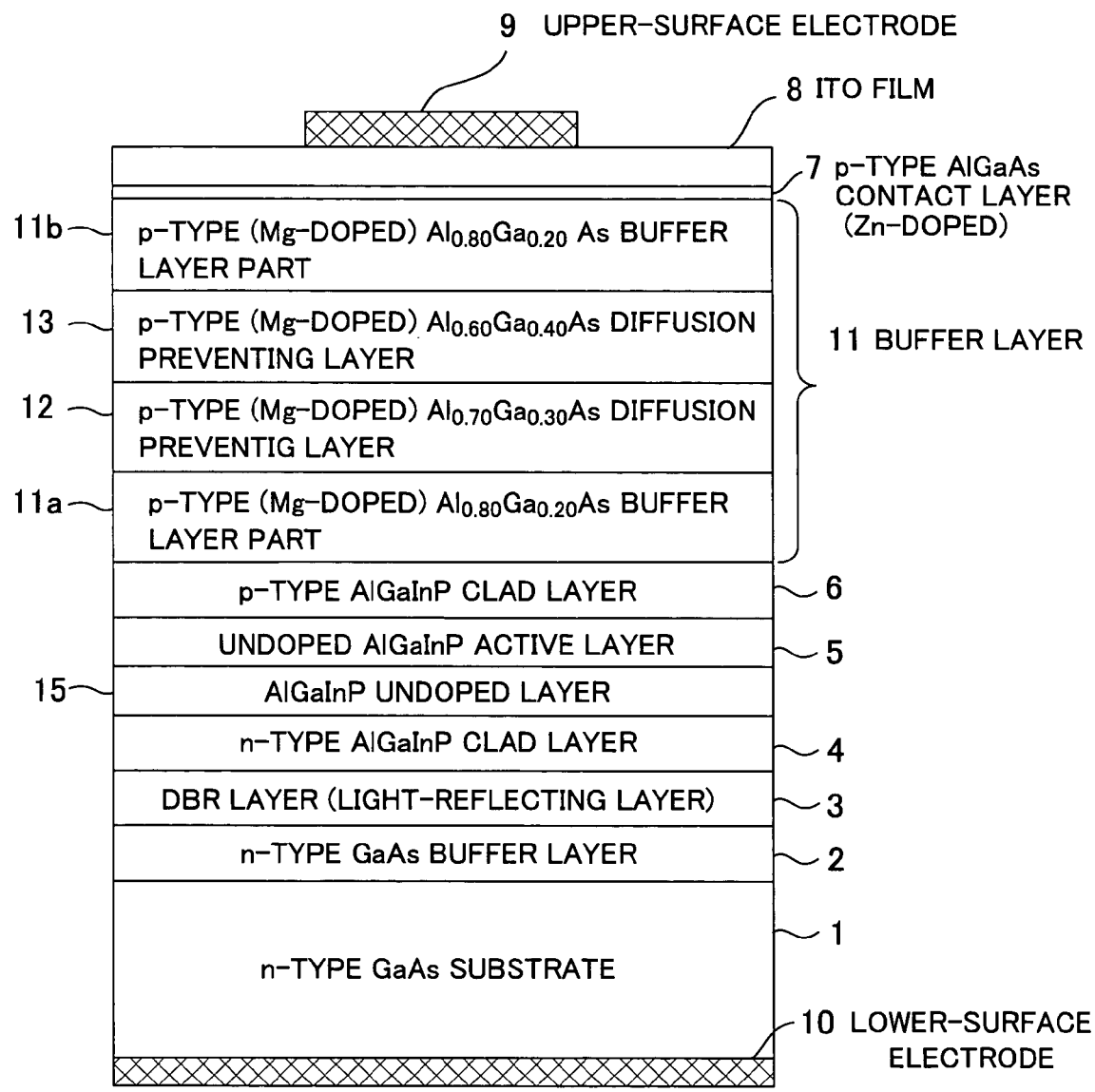
FIG. 4 is a schematic cross sectional view showing a modification of an AlGaInP-based red LED according to the invention.

In any structures in Examples of the invention, no layer is interposed between the active layer 5 and the n-type AlGaInP clad layer 4. Alternatively, the following structure may be employed. As shown in FIG. 4, an intrinsic undoped layer, i.e., a diffusion preventing layer 15 comprising, e.g., an AlGaInP undoped layer, may be formed between the active layer 5 and the n-type AlGaInP clad layer 4. Also, a pseudo-undoped layer to pseudo-serve as an undoped layer even when containing some conductive impurity may be formed. Further, a low-carrier density clad layer (n-type low-density layer) with a relatively low carrier density may be formed.

In Examples according to the present invention, only a red LED device having an emission wavelength of 630 nm is manufactured as an example. However, in another LED device manufactured by using the same AlGaInP-based material, for example, in an LED device having an emission wavelength of 560 to 660 nm, the materials and carrier densities of the respective layers used at this time, in particular, window layers do not have different points. Therefore, if the emission wavelength of the LED device is set in a wavelength band different from the above wavelength band, the same desired effect of the present invention can be obtained.

In Examples according to the present invention, the n-type GaAs buffer layer 2 is formed on the n-type GaAs substrate 1. However, even though a structure in which the n-type clad layer 4 is directly stacked on the n-type GaAs substrate I or a structure in which the DBR layer 3 is stacked on the n-type GaAs substrate 1 is employed, the same desired effect of the present invention can be obtained.

In Examples according to the present invention, a structure in which the shape of the upper-surface electrode 9 is always circular is employed. However, even though the shape is, for example, a square, a lozenge, a polygon, or the like, the effect planned by the present invention can be obtained.

In Examples according to the present invention, then-type GaAs substrate 1 using GaAs is exemplified. However, in addition, an epitaxial wafer for LED using Ge as a start substrate or an epitaxial wafer for LED using GaAs or Ge (will be removed later) as a start substrate and using a metal substrate having a heat conductivity equal to or higher than that of Si as an alternative independent substrate, the same effect planned by the present invention can be obtained.

In Examples according to the present invention, the p-type clad layer 6 comprises AlGaInP. However, AlInP or a material transparent with respect to an emission wavelength may be used. When a combination except for the combinations in Examples is used, the same effect planned by the present invention can be obtained.

COMPARATIVE EXAMPLE 1

Figure 5:
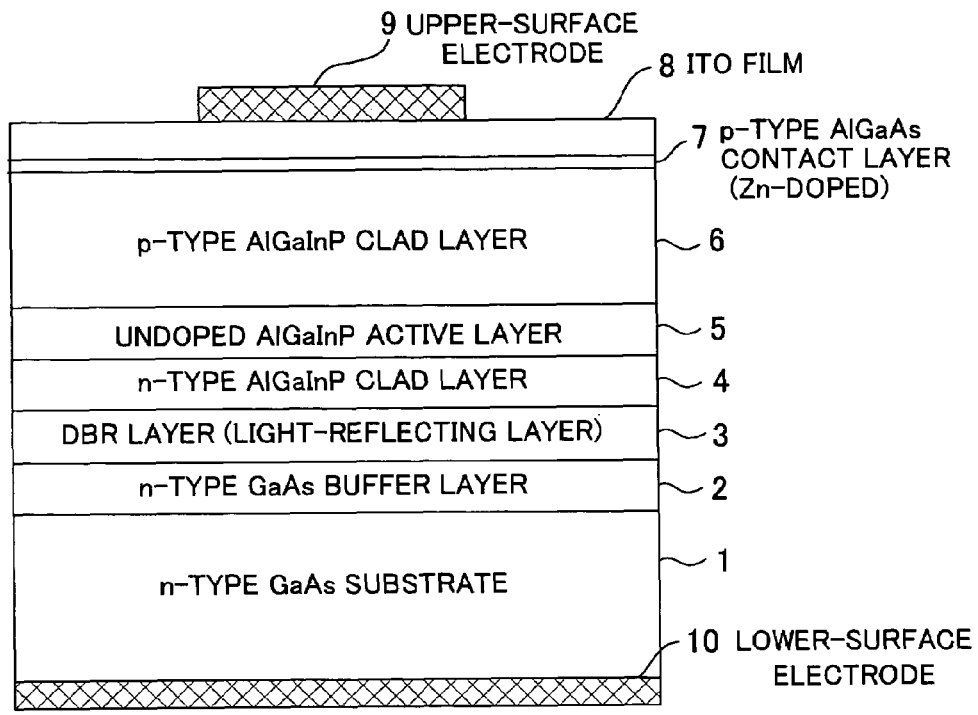
FIG. 5 is a schematic cross sectional view showing an AlGaInP-based red LED in Comparative Example 1.

As Comparative Example 1, an epitaxial wafer for red LED having the structure as shown in FIG. 5 and an emission wavelength of about 630 nm is manufactured. An epitaxial growth method, an epitaxial layer thickness, an epitaxial layer structure, and an LED device manufacturing method are basically the same as those in Example 1. An ITO film thickness and a film forming method are the same as those in Example 1. The different point between Example 1 and Comparative Example 1 is the following point.

In Comparative Example 1, a structure in which the p-type contact layer 7 is directly formed on the p-type clad layer 6 without forming a buffer layer. However, the thickness of the p-type clad layer 6 is set at 300 nm equal to that of Example 1.

The epitaxial wafer for LED manufactured as described above is made into a device. The process of making the epitaxial wafer into a device is the same as that in Example 1.

Initial characteristics of the LED device manufactured as described above are evaluated. As a result, an optical output of 1.75 mW and an operation voltage of 1.91 V during power feeding at 20 mA (in evaluation) could be obtained as the initial characteristics.

However, when a reliability test is executed to the LED device under the same conditions as those in Example 1, a relative output is 65%, and an operation voltage increased by about 3%.

The LED devices of Comparative Example 1 in both a state obtained immediately after the LED device is manufactured and a state obtained after the burn-in test under the aforementioned conditions are subjected to an SIMS analysis as in Example 1. As a result, it is confirmed that the Zn serving as a dopant of the p-type contact layer 7 is diffused and detected in the active layer in the LED device of Comparative Example 1 after the burn-in test. More specifically, shortening of a lifetime of the LED device described in Comparative Example 1, i.e., deterioration of reliability is caused by the dopant diffusion.

COMPARATIVE EXAMPLE 2

Figure 6:
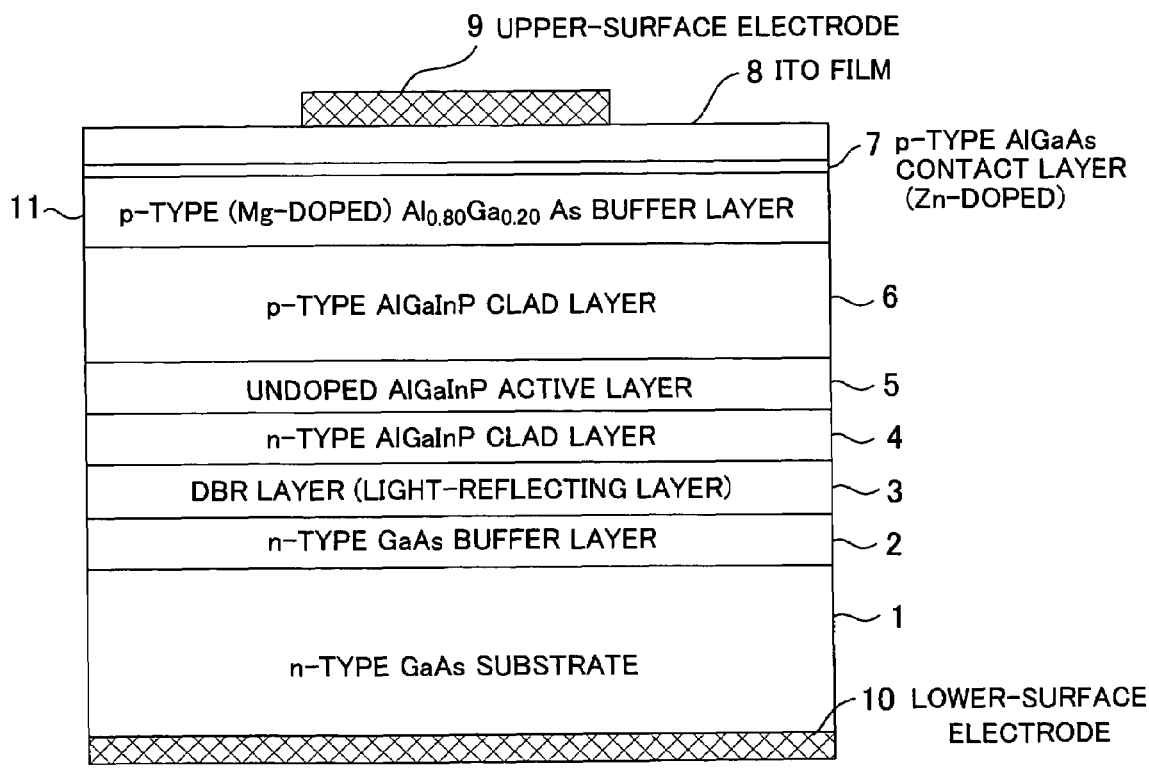
FIG. 6 is a schematic cross sectional view showing an AlGaInP-based red LED in Comparative Example 2.

As Comparative Example 2, an epitaxial wafer for red LED having the structure as shown in FIG. 6 and an emission wavelength of about 630 nm is manufactured. An epitaxial layer thickness and an epitaxial structure will be described below. An epitaxial growing method, an electrode forming method, and an LED device manufacturing method are the same as those in Example 1. An ITO film thickness and a film forming method are the same as those in Example 1. The different point between Example 1 and Comparative Example 2 is the following point.

Comparative Example 2 employed a structure in which a single buffer layer 11 comprising a uniform material and the same composition is formed between the p-type clad layer 6 and the contact layer 7. However, the buffer layer 11 has the same structure as that of the buffer layer part 11a of Example 1 or the buffer layer part 11b of Example 1. The film thickness of the p-type clad layer 6 is set at 300 nm as in Example 1.

Initial characteristics of the LED device manufactured as described above are evaluated. As a result, an optical output of 1.80 mW and an operation voltage of 1.90 V during power feeding at 20 mA (in evaluation) could be obtained as the initial characteristics.

However, the LED device is driven at 50 mA in an environment of an atmospheric humidity and directly subjected to a reliability test by the same continuous burn-in test as that in Example 1. As a result, a relative output is 51%, and an operation voltage increased by about 3%.

Figure 7:
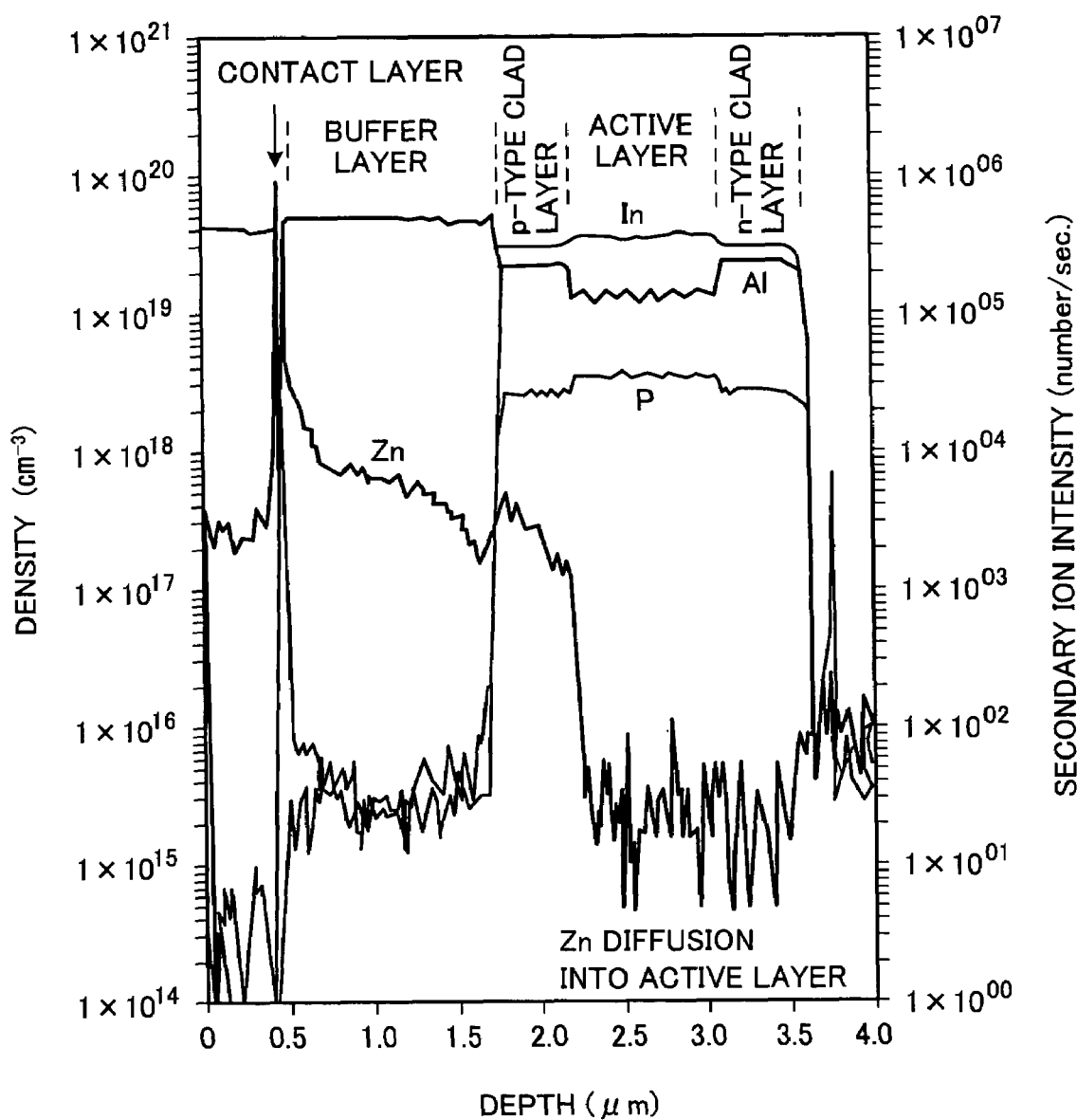
FIG. 7 is a graph showing an SIMS analysis result of the AlGaInP-based red LED in Comparative Example 2.

The LED devices of Comparative Example 2 in both a state obtained immediately after the LED device is manufactured and a state obtained after the burn-in test under the aforementioned conditions are subjected to an SIMS analysis as in Example 1. A result of the SIMS analysis is shown in FIG. 7. As a result, it is confirmed that the Zn serving as a dopant of the p-type contact layer 7 is diffused and detected in the active layer in the LED device of Comparative Example 2 after the burn-in test.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light-emitting device with a transparent conductive film, comprising:
    a light-emitting portion formed on a semiconductor substrate, said light-emitting portion comprising at least an n-type clad layer, an active layer and a p-type clad layer doped with Mg;
    an As-based contact layer formed on said light-emitting portion, said contact layer being doped with Zn as a p-type dopant of $1\times10^{19}/cm^3$ or more;
    a current spreading layer formed on said contact layer, said current spreading layer comprising a transparent conductive film of a metal oxide material; and
    a buffer layer formed between said contact layer and said p-type clad layer;
    wherein said buffer layer comprises at least two or more buffer layer parts, and adjacent buffer layer parts are different from each other in material or composition,
    wherein said buffer layer parts comprise a material that is transparent with respect to a light with an emission peak wavelength, and
    wherein at least one of said two or more buffer layer parts alternately formed comprises an undoped layer.

2. The semiconductor light-emitting device with a transparent conductive film according to claim 1, wherein:
    said undoped layer has a carbon density of $5\times10^{17}$ atoms/$cm^3$ or less.

* * * * *